United States Patent
Wang et al.

(10) Patent No.: US 6,440,841 B2
(45) Date of Patent: *Aug. 27, 2002

(54) METHOD OF FABRICATING VIAS

(75) Inventors: Chein-Cheng Wang, Taichung Hsien; Shih-Chanh Chang, Hsinchu, both of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/289,859

(22) Filed: Apr. 12, 1999

(51) Int. Cl.⁷ .......................................... H01L 21/4763
(52) U.S. Cl. ..................... 438/629; 438/627; 438/653; 438/646; 438/913; 438/688
(58) Field of Search ................. 438/629, 618, 438/627, 643, 653, 688, 637, 649, 654, 655, 622, 652, 646, 661, 913; 427/250, 383.1, 404

(56) References Cited

U.S. PATENT DOCUMENTS 5,356,836 A * 10/1994 Chen et al. ................. 438/627
5,523,259 A * 6/1996 Merchant et al. ............ 438/643
5,543,357 A * 8/1996 Yamada et al. ............. 438/646
5,677,238 A * 10/1997 Gn et al. .................... 438/653
5,804,251 A * 9/1998 Yu et al. .................... 427/250
5,904,562 A * 5/1999 Nulman ...................... 438/654
6,107,182 A * 8/2000 Asahina et al. ............. 438/616

* cited by examiner

Primary Examiner—Matthew Smith
Assistant Examiner—Igwe U. Anya
(74) Attorney, Agent, or Firm—J.C. Patents

(57) ABSTRACT

The present invention is a method of fabricating interconnects. A semiconductor substrate having a dielectric layer is provided. The dielectric layer has a via opening therein, which exposes the semiconductor substrate. Next, the surfaces of the via opening is covered with a conformal titanium layer formed by a sputtering process. The surface of the conformal titanium layer is covered with an Al—Si—Cu alloy layer formed by a sputtering process at a temperature of about 0° C. to 200° C. Then, the surface of the Al—Si—Cu alloy layer is covered with an Al—Cu alloy layer formed by a sputtering process at a temperature of about 380° C. to 450° C., which Al—Cu alloy layer fills the via opening. The Al—Cu alloy layer, the Al—Si—Cu alloy layer and the wetting layer on the dielectric layer are patterned by photolithography and etching process.

10 Claims, 3 Drawing Sheets

METHOD OF FABRICATING VIAS

BACKGROUND OF THE INVENTION

1. Field of the Invention

The invention relates to a method of fabricating an integrated circuit, and particularly to a method of fabricating a multilevel interconnect.

2. Description of the Related Art

In integration circuit process for semiconductor devices, the interconnects are provided between two devices for allowing electrical connection between different devices or components. Aluminum is one conducting material that has been widely used to fabricating vias. The main reasons for the pervasiveness of aluminum are its low resistivity and its good adhesion to silicon oxides and silicon.

Referring to FIG. 1A, in the conventional process for manufacturing vias using aluminum, a wetting layer 18 formed of titanium is deposited in the via opening 16. An aluminum layer 20 is deposited by a sputtering process to fill the via opening 16. The wetting layers 18 and the aluminum layer 20 left in the via opening 16 form a via plug. The wetting layer 18 and the aluminum layer 20 on the dielectric layer 14 are patterned by photolithography process and an etch process, as shown in FIG. 1B.

In the above conventional process, the aluminum layer 20 formed by a sputtering process reacts with the titanium wetting layer 18 to form byproduct $AlTi_3$ during the aluminum deposition step. Therefore, the step coverage of the aluminum layer 20 is affected and becomes poor. The via-filling process suffers from the poor step coverage, and voids 30 are formed in the via plug consequently. This affects the device reliability. In addition, the vias formed of aluminum further suffers an electromigration problem. More specifically, an annealing step is performed after the sputter deposition of aluminum, so that the aluminum is usually in poly-crystalline state. The aluminum atoms move along the grain boundary in an electric field, and the movement results in an open-circuit failure. This also affects device reliability.

SUMMARY OF THE INVENTION

The invention provides a method of fabricating interconnects. A semiconductor substrate having a dielectric layer is provided. The dielectric layer has at least a via opening, and the via opening expose a part of the semiconductor substrate. A titanium layer is formed along a surface profile of the via opening. The surface of the titanium layer is covered with an Al—Si—Cu alloy layer formed by a sputtering process at a substantially low temperature. The via openings are filled with an Al—Cu alloy layer formed by a sputtering process at a substantially high temperature, such that the Al—Cu alloy covers the surface of the Al—Si—Cu alloy layer.

In one preferred embodiment of the method of the present invention, the Al—Si—Cu alloy layer is formed at a temperature of about 0° C. to about 200° C. The composition of the Al—Si—Cu alloy layer has a silicon weight percentage of about 0.5% to about 1% and a copper weight percentage of about 0.4% to about 0.6%. The Al—Cu alloy layer is formed at a temperature from about 380° C. to about 450° C. The composition of the Al—Cu alloy layer has a copper weight percentage of about 0.4% to about 0.6%. The Al—Si—Cu alloy layer and the Al—Cu alloy layer comprise copper, so that the electromigration can be inhibited. The Al—Si—Cu alloy layer formed at a low temperature comprises silicon, so that the formation of the byproduct $AlTi_3$ from the reaction of aluminum and titanium can be suppressed. Because the byproduct is suppressed from being formed, the Al—Si—Cu alloy layer thus inheres continuity which results in a good step coverage. In addition, the Al—Cu alloy layer is formed at a high temperature, which prevents the precipitation of silicon during the sputtering step of the Al—Cu alloy layer and avoids a silicon nodule after a metal etching step in the following process. The Al—Si—Cu alloy layer is between the Al—Cu alloy layer and the titanium layer, so that aluminum of the Al—Cu alloy layer does not react with titanium to produce $AlTi_3$ byproducts. Thus, the step coverage of the Al—Cu alloy layer is not affected, and the filling problem can be suppressed. Therefore, the method of the present invention can be used to improve the step coverage and to avoid forming voids in the vias, so that the reliability of devices can be increased.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In the preferred embodiment of the method according to the present invention, the process of fabricating a via is described. However, it is to be understood that the invention is not limited thereto. In fact, the method of the present invention can be applied in the process of fabricating a contact.

Figure 1A:
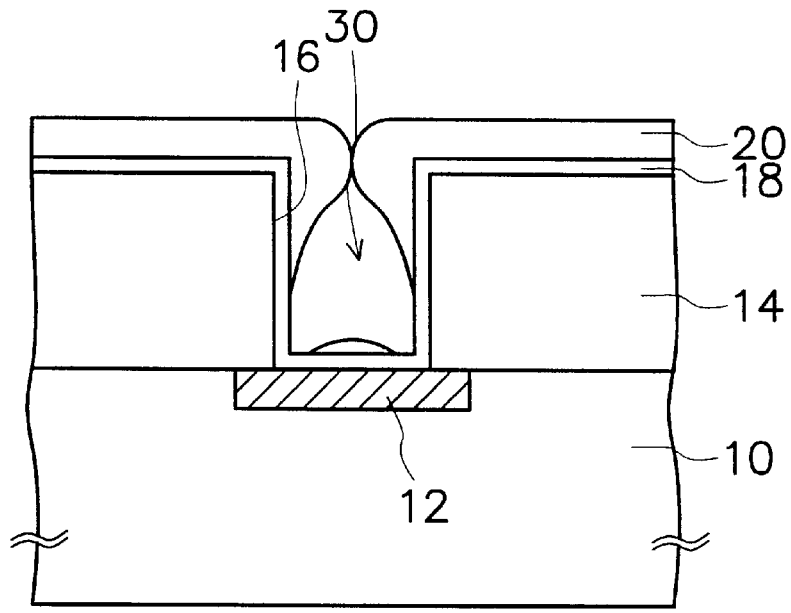
FIGS. 1A–1B are schematic, cross-sectional views illustrating of a method of fabricating interconnection according to prior art method.
Figure 1B:
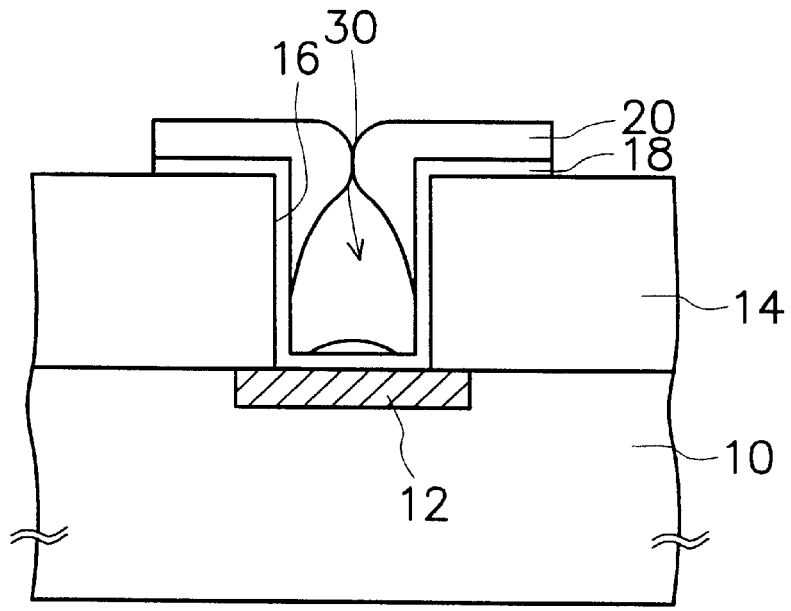
Figure 2A:
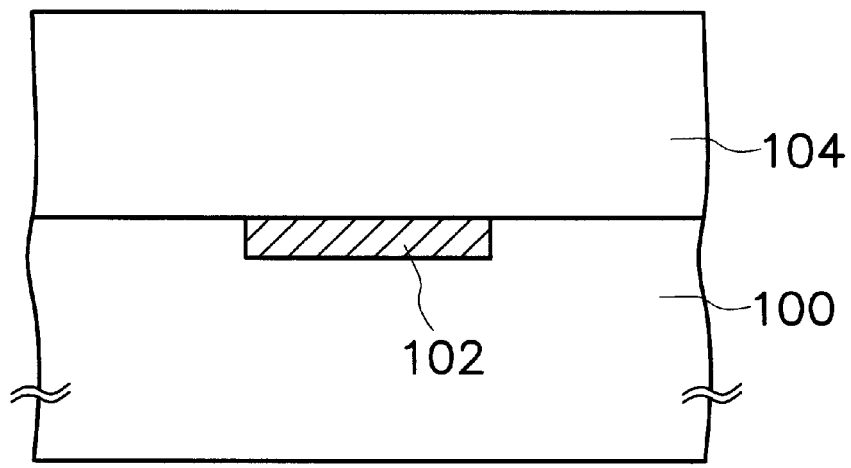
FIGS. 2A–2D are schematic, cross-sectional views illustrating of a method of fabricating interconnection according to preferred embodiment of the method according to the present invention.

Referring to FIG. 2A, a dielectric layer 104 is formed on a semiconductor substrate 100 having a conducting area 102. In the preferred embodiment of the method of the present invention, the conducting area 102 comprises a patterned metal layer. The conducting area 102 comprises a doping area or a gate when the method is used to fabricate contacts. A material for suitable forming the dielectric layer comprises, for example, silicon oxide, phosphosilicate glass (PSG) or borophosphosilicate glass (BPSG) formed by chemical vapor deposition (CVD), or spin-on-glass formed by spin coating. The dielectric layer 104 is planarized by, for example, a chemical mechanical polishing process in order to provide a smooth surface for subsequent processes.

Figure 2B:
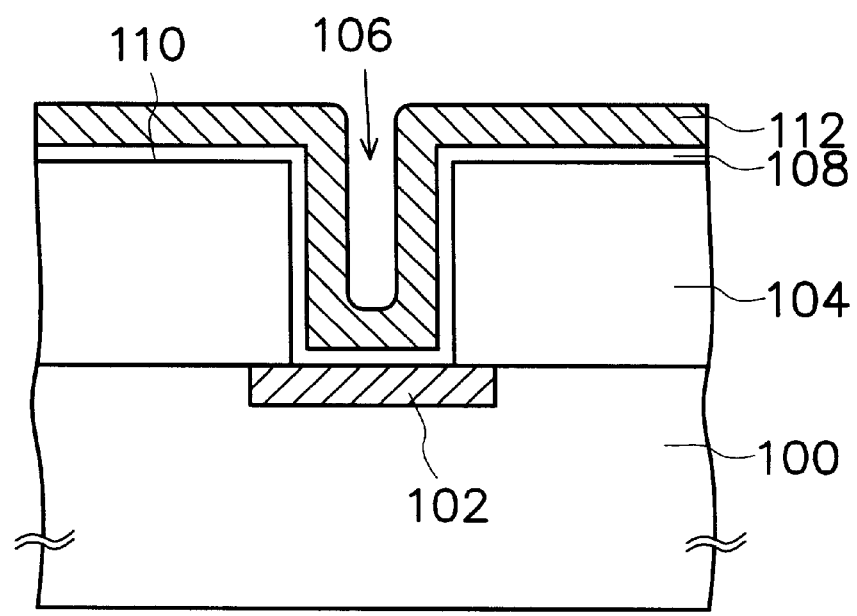

Referring to FIG. 2B, photolithography and etching is performed on the dielectric layer 104 in order to form a via opening 106 therein, which exposes the conducting area 102 on the semiconductor substrate 100. The opening 106 comprises a contact opening when the method is used to fabricate contacts. The etching process is performed by, for example, anisotropic etching, such as a plasma process, with $CF_4$, $CHF_3$ or $C_2F_6$, and $C_3F_8$ as gas sources. A conformal wetting layer 108 is formed on the semiconductor substrate 100 to cover an upper surface 110 of the dielectric layer 104 and a surface of the via opening 106. A suitable material for forming the wetting layer 108 comprises, for example, a titanium layer with a thickness of about 1500 Å to about 4000 Å. The wetting layer 108 is formed by for example, a sputtering process at an room temperature of about 20° C. to about 30° C.

Still referring to FIG. 2B, because the electromigration resistance of aluminum is poor and in order to improve the step coverage of filling the via opening 106 with metal, an Al—Si—Cu alloy layer 112 is formed on the wetting layer 108 by a sputtering process at a low temperature. Preferably, the Al—Si—Cu alloy layer 112 is formed at a temperature of about 0° C. to about 200° C. The Al—Si—Cu alloy layer 112 has a silicon weight percentage of about 0.5% to about 1% and a copper weight percentage of about 0.4% to about 0.6%. The thickness of the Al—Si—Cu alloy layer 112 is about 2000 Å to about 3000 Å. The Al—Si—Cu alloy layer 112 comprises copper, so that the electromigration can be inhibited. In addition, the Al—Si—Cu alloy layer 112 comprises silicon, so that a byproduct, AlTi$_3$, formed from the reaction of aluminum and titanium can be suppressed. Because the byproduct is suppressed from being produced, the Al—Cu alloy layer 114 inheres continuity. The continuous Al—Si—Cu alloy layer provides a good step coverage.

Figure 2C:
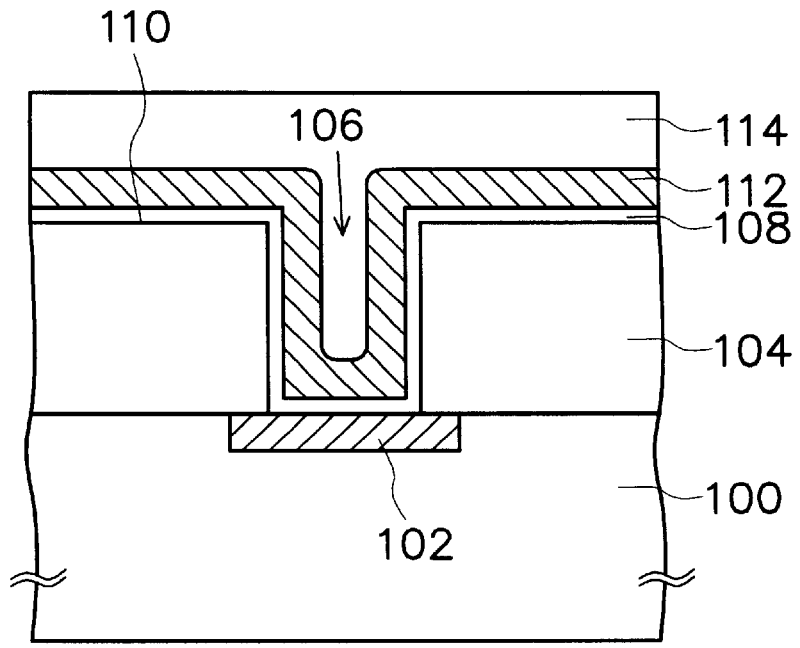

Referring to FIG. 2C, an Al—Cu alloy layer 114 is formed on the Al—Si—Cu alloy layer 112 to fill the remaining space of the via opening 106. Preferably, the Al—Si—Cu alloy layer 112 is formed at a temperature of about 380° C. to about 450° C. and the Al—Si—Cu alloy layer 112 has a copper weight percentage of about 0.4% to about 0.6%.

Typically, the Al—Si—Cu layer 112 is very thick when the via is formed from of one Al—Si—Cu layer. If the Al—Si—Cu is too thick, precipitate of silicon is formed during the sputtering step of the Al—Si—Cu layer. The silicon precipitate is to be removed with difficulty. Thus, the etching process of fabricating the connection takes a long time, otherwise, the silicon residue of the silicon precipitate makes a bridge between two wiring lines formed in subsequent processes. However, when the etching back process consumes a long time, the thickness loss of the dielectric layer becomes serious. Therefore, in the present invention, the via opening 106 is not only filled with Al—Si—Cu alloy layer 112. That is, the via opening 106 is partially filled with the wetting layer 108, partially filled with the Al—Si—Cu alloy layer 112 formed by sputtering at the low temperature, and partially filled with the Al—Cu alloy 114. The Al—Si—Cu alloy layer 112 is so thin that the formation and the growth of the silicon precipitates are suppressed.

Furthermore, the Al—Si—Cu alloy layer 112 is formed between the Al—Cu alloy layer 114 and the wetting layer 108, so that aluminum in the Al—Cu alloy layer 114 does not react with the wetting layer 108 formed of titanium to produce byproduct AlTi$_3$. Since the step coverage of the Al—Cu alloy layer 114 cannot be affected, the filling problem can be avoided.

Figure 2D:
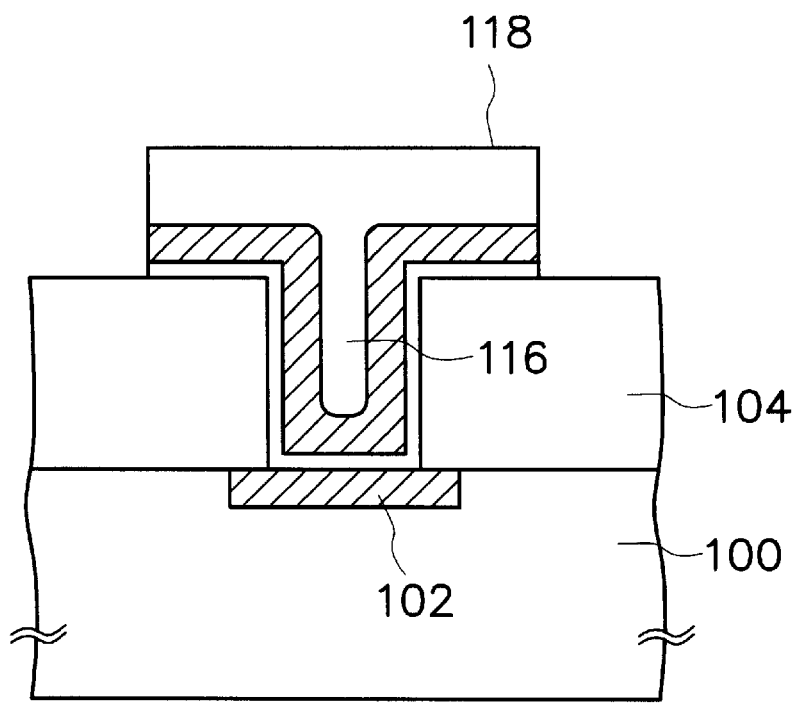

Referring to FIG. 2D, photolithography and etching is performed on the wetting layer 108, the Al—Si—Cu alloy layer 112, and the Al—Cu alloy layer 114 over the dielectric layer 104 in order to form a wiring line 118. The wetting layer 108, the Al—Si—Cu alloy layer 112, and the Al—Cu alloy layer 114 form a via plug 116.

Since the thickness of the Al—Si—Cu alloy layer 112 is about 2000 Å to about 3000 Å, the formation and the growth of the silicon precipitates are suppressed. Therefore, it does not take a longer time to remove the silicon precipitates during the etching process of fabricating wiring lines. The time of the etching back is short, so that the thickness of the dielectric layer loss is prevented. In addition, the problem of residual silicon nodules making a bridge between two wiring lines in subsequent processes can be avoided.

In the method of the present invention, the wetting layer is formed along a surface profile of the via opening. The Al—Si—Cu alloy layer is formed on the wetting layer by a sputtering process at a low temperature. The Al—Cu alloy layer fills the remaining space of the via opening. The Al—Si—Cu alloy layer and the Al—Cu alloy layer comprise copper, so that the electromigration can be inhibited. The Al—Si—Cu alloy layer formed at a low temperature comprises silicon, so that the formation of the byproduct AlTi$_3$ from the reaction of aluminum and titanium can be suppressed. It can provide good step coverage because the Al—Si—Cu alloy layer is continuous. The Al—Si—Cu alloy layer is formed between the Al—Cu alloy layer and the wetting layer formed from titanium, so that aluminum of the Al—Cu alloy layer does not react with titanium to from AlTi$_3$ byproducts. Thus, the step coverage of the Al—Cu alloy layer is not affected, and the filling problem can be suppressed. Therefore, the method of the present invention can be used to suppress electromigration, to improve the step coverage and to avoid voids be formed in the vias, so that the reliability of devices can be increased.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating an interconnect, comprising:

providing a semiconductor substrate having a conducting area;

forming a dielectric layer on the semiconductor substrate, the dielectric layer having a via opening exposing the conducting area;

forming a conformal wetting layer comprising titanium on the via opening;

forming an Al—Si—Cu alloy layer on the conformal wetting layer by a sputtering process at a temperature in a range from about 0° C. to about 200° C., the Al—Si—Cu alloy layer containing about 0.5 weight % to about 1 weight % of silicon and about 0.4 weight % to about 0.6 weight % of copper, and the Al—Si—Cu alloy layer being formed without any significant generation of AlTi$_3$ byproducts; and forming an Al—Cu alloy layer on and adjacent to the Al—Si—Cu alloy layer to fill the via opening by a sputtering process at a temperature in a range from about 380° C. to about 450° C., the Al—Cu alloy layer containing about 0.4 weight % to about 0.6 weight % of copper, wherein the aluminum in the Al—Cu alloy layer does not react with titanium in the wetting layer to form AlTi$_3$ byproducts.

2. The method as claimed in claim 1, wherein the conformal wetting layer comprises titanium formed by a sputtering process.

3. The method as claimed in claim 1, further comprising:

defining the Al—Cu alloy layer, the Al—Cu-Si alloy layer, and the conformal wetting layer on the dielectric layer.

4. A method of fabricating a contact, comprising the steps of:
- providing a dielectric layer on the semiconductor substrate, the dielectric layer having an opening exposing a part of the semiconductor substrate;
- forming a titanium layer along a surface profile of the opening;
- forming an Al—Si—Cu alloy layer on the titanium layer at a first temperature, the Al—Si—Cu alloy layer containing about 0.5 weight % to about 1 weight % of silicon and about 0.4 weight % to about 0.6 weight % of copper, and the Al—Si—Cu alloy layer being formed without any significant generation of $AlTi_3$ byproducts; and
- forming an Al—Cu alloy layer directly on the Al—Si—Cu alloy layer at a second temperature to fill the opening, the Al—Cu alloy layer containing about 0.4 weight % to about 0.6 weight % of copper; wherein the first temperature is lower than the second temperature, and wherein the aluminum in the Al—Cu alloy layer does not react with titanium in the titanium layer to form $AlTi_3$ byproducts.

5. The method as claimed in claim 4, wherein the titanium layer is formed by a sputtering process.

6. The method as claimed in claim 5, wherein the first temperature at which the Al—Si—Cu alloy layer is formed is in a range from about 0° C. to about 200° C.

7. The method as claimed in claim 6, wherein the second temperature at which the Al—Cu alloy layer is formed is in a range from about 380° C. to about 450° C.

8. The method as claimed in claim 4, wherein the first temperature at which the Al—Si—Cu alloy layer is formed is in a range from about 0° C. to about 200° C.

9. The method as claimed in claim 8, wherein the second temperature at which the Al—Cu alloy layer is formed is in a range from about 380° C. to about 450° C.

10. The method as claimed in claim 4, wherein the second temperature at which the Al—Cu alloy layer is formed is in a range from about 380° C. to about 450° C.

* * * * *